US007350173B1

(12) United States Patent
Ang et al.

(10) Patent No.: US 7,350,173 B1
(45) Date of Patent: Mar. 25, 2008

(54) METHOD AND APPARATUS FOR PLACEMENT AND ROUTING CELLS ON INTEGRATED CIRCUIT CHIPS

(75) Inventors: Roger P. Ang, Cypress, CA (US); Ken R. McElvain, Houston, TX (US); Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 461 days.

(21) Appl. No.: 10/351,094

(22) Filed: Jan. 23, 2003

Related U.S. Application Data (60) Provisional application No. 60/388,492, filed on Jun. 11, 2002.

(51) Int. Cl.
 *G06F 17/50* (2006.01)
(52) U.S. Cl. .............................................. 716/8; 716/9
(58) Field of Classification Search .............. 716/7–14, 716/15
 See application file for complete search history.

(56) References Cited

U.S. PATENT DOCUMENTS

| | | | | |
|---|---|---|---|---|
| 5,461,576 A * | 10/1995 | Tsay et al. ...................... | 716/6 |
| 6,074,430 A * | 6/2000 | Tsukiboshi ...................... | 716/9 |
| 6,249,902 B1 * | 6/2001 | Igusa et al. ..................... | 716/10 |
| 6,311,313 B1 * | 10/2001 | Camporese et al. ........... | 716/6 |
| 6,378,114 B1 * | 4/2002 | Shenoy et al. ................. | 716/7 |
| 6,480,991 B1 * | 11/2002 | Cho et al. ....................... | 716/8 |
| 6,505,335 B1 * | 1/2003 | Tanaka ........................... | 716/13 |
| 6,516,456 B1 * | 2/2003 | Garnett et al. .................. | 716/8 |
| 6,519,750 B2 * | 2/2003 | Yamashita ...................... | 716/10 |
| 6,546,541 B1 * | 4/2003 | Petranovic et al. ............ | 716/18 |
| 6,598,215 B2 * | 7/2003 | Das et al. ....................... | 716/12 |
| 6,601,226 B1 * | 7/2003 | Hill et al. ....................... | 716/10 |
| 6,609,238 B1 * | 8/2003 | Tetelbaum ...................... | 716/10 |
| 6,701,289 B1 * | 3/2004 | Garnett et al. ................. | 703/14 |
| 6,704,916 B1 * | 3/2004 | Nishida et al. ................ | 716/10 |
| 6,735,742 B2 * | 5/2004 | Hatsch et al. ................... | 716/2 |
| 6,889,370 B1 * | 5/2005 | Kerzman et al. ............... | 716/8 |
| 7,051,310 B2 * | 5/2006 | Tsao et al. ...................... | 716/10 |
| 2001/0021992 A1 * | 9/2001 | Yamashita ...................... | 716/8 |
| 2003/0005398 A1 * | 1/2003 | Cho et al. ....................... | 716/8 |

\* cited by examiner

*Primary Examiner*—Jack Chiang
*Assistant Examiner*—Binh Tat
(74) *Attorney, Agent, or Firm*—Blakely, Sokoloff, Taylor & Zafman LLP (57) ABSTRACT

Methods and apparatuses to place and route cells on integrated circuit chips along paths. In one aspect of the invention, methods to layout an integrated circuit are based on placing and routing cells along paths. In one embodiment, a method to layout an integrated circuit including: routing a wire to connect a first cell of the integrated circuit and a second cell of the integrated circuit; and placing a third cell of the integrated circuit after the wire is routed to connect the first cell and the second cell. In one example, the first, second and third cells are on a first path; and, the third cell is connected to one of the first and second cells on the first path by only one net. The first path is selected from a set of paths; and the first and second cells are placed before the wire is routed to connect the first cell and the second cell. Timing is analyzed using a route of the wire connecting the first cell and the second cell to select a second path from the set of paths before a cell is placed on the second path.

18 Claims, 9 Drawing Sheets

METHOD AND APPARATUS FOR PLACEMENT AND ROUTING CELLS ON INTEGRATED CIRCUIT CHIPS

This application claims the benefit of the filing date of provisional application Ser. No. 60/388,492, filed Jun. 11, 2002, and entitled "Method and Apparatus for Placement and Routing Cells on Integrated Circuit Chips" by the inventors Roger P. Ang, Ken R. McElvain, and Kenneth S. McElvain.

FIELD OF THE INVENTION

The invention relates to designing integrated circuits, and more particularly to incremental placement and routing cells for integrated circuits.

BACKGROUND OF THE INVENTION

For the design of digital circuits on the scale of VLSI (very large scale integration) technology, designers often employ computer-aided techniques. Standard languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technologies/architectures to implement logic circuits within their integrated circuits. Thus, the technology independent RTL netlist is mapped to create a netlist which is specific to a particular vendor's technology/architecture.

One operation which is often desirable in this process is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and the routing typically runs faster because as it has been reduced from one very large problem into a series of simpler problems.

Figure 2:
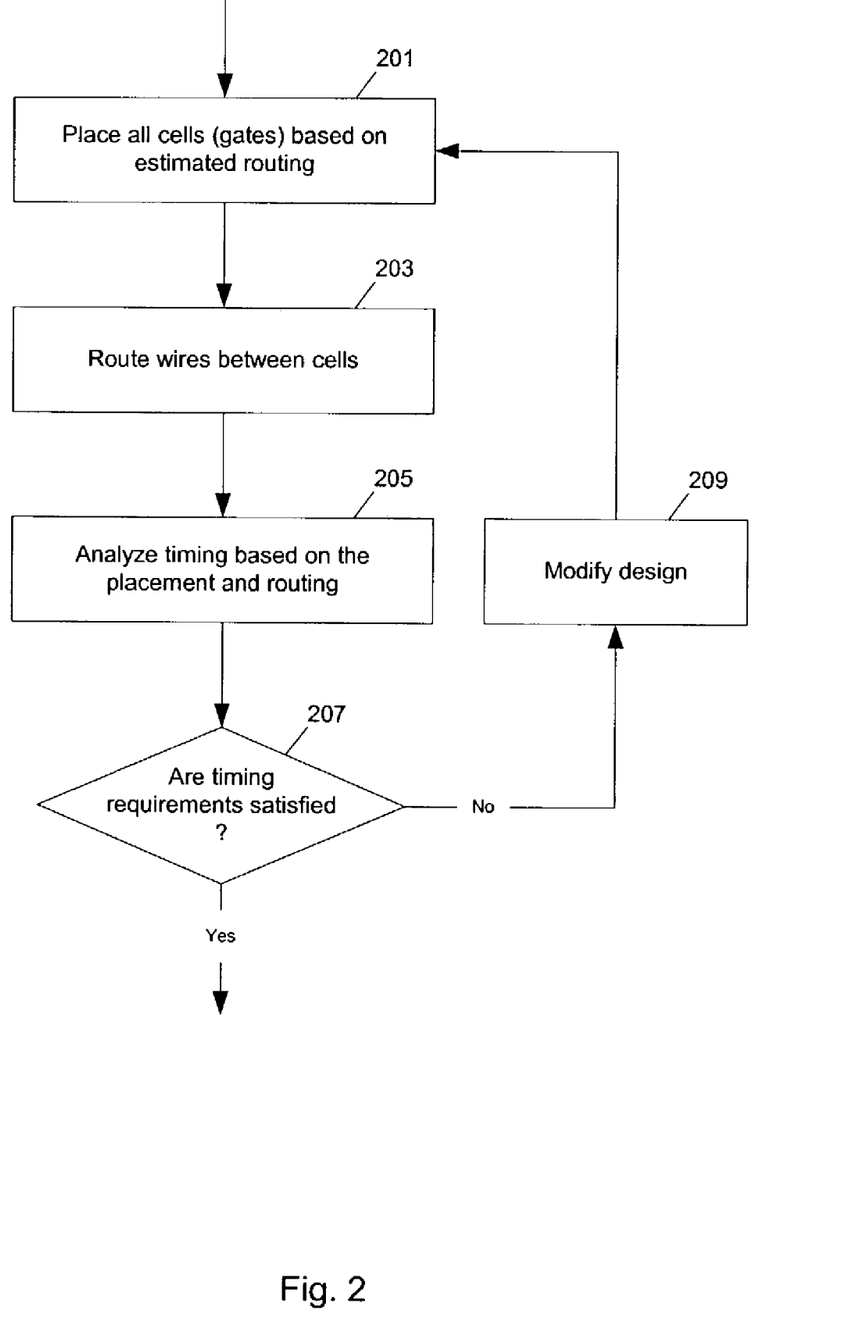
FIG. 2 shows a conventional method to place and route the cells of an integrated circuit.

After the logic elements are placed into blocks, the cells (e.g., gates or transistors) are placed and routed in the area for a chip. FIG. 2 shows a conventional method to place and route the cells of an integrated circuit. After operation 201 places all cells for the integrated circuit, operation 203 routes wires between cells. Thus, the operations of placing and routing are separated. Since the placement is performed without actual routing, the placement of the cells is based on the estimated routing. Once the wires are actually routed, operation 205 can analyze timing accurately based on the placement and routing information. If operation 207 determines that the timing requirements (e.g., slack) are not satisfied, the previous design may be modified in operation 209, before the cells are placed again in operation 201.

Slack is the difference between the desired delay and the actual (estimated or computed) delay. When the desired delay is larger than the actual delay, the slack is positive; otherwise, the slack is negative. Typically, it is necessary to make the slack positive (or close to zero) to meet the timing requirement (e.g., reducing the wire delay to increase the slack).

Thus, the conventional method separates the phases of placement and routing. The cells (e.g., gates) of a design are fully placed (e.g., assigned locations) before the wires are actually routed. Multiple iterations of this process may be applied but the design is typically still fully placed before routing is assigned (or reassigned).

Because the wires are not routed at the same time as placement, conventional placement algorithms estimate the result of routing. These estimates do not account for the available information of routed wires, even if only a small part of an already placed and routed design is being modified.

SUMMARY OF THE INVENTION

Methods and apparatuses to place and route cells on integrated circuit chips along paths are described here.

In one aspect of the invention, methods to layout an integrated circuit are based on placing and routing cells along paths. In one embodiment of the present invention, a method to layout an integrated circuit including: routing a wire to connect a first cell of the integrated circuit and a second cell of the integrated circuit; and placing a third cell of the integrated circuit after the wire is routed to connect the first cell and the second cell. In one example, the first, second and third cells are on a first path; and, the third cell is connected to one of the first and second cells on the first path by only one net. The first path is selected from a set of paths; and, the first and second cells are placed before the wire is routed to connect the first cell and the second cell. In one example, timing is analyzed using the route of the wire connecting the first cell and the second cell to generate first timing information; and, a second path is selected from the set of paths from a timing analysis using the first timing information, before the cells of the second path is placed. In one example, it is determined whether or not the third cell is previously placed; and the third cell is relocated in response to a determination that: a) the third cell is previously placed on a third path, b) the third cell is either a converging point or a diverging point of the first path and the third path, and, c) the third cell has positive slack. In one example, wire delays for placing the third cell at a plurality of locations are determined; and, a first location is selected for the third cell from the plurality of locations according to timing based on the wire delays. In one example, the first location results in the lowest routing congestion and slack larger than a threshold for the third cell among the plurality of locations; in another example, the first location results in the largest slack for the third cell among the plurality of locations.

In one embodiment of the present invention, a method to layout an integrated circuit includes: grouping cells in paths; and placing the paths one after another. In one example, a first set of cells of a first path are determined; a second set of cells of a second path are determined; the second set of cells are placed after the first set of cells are placed. In one example, the first and second path contains common cells; and, both the first and second sets contain a third set of cells. In one example, the third set of cells are not repositioned when placing the second set of cells, since they are already placed in placing the first set of cells. In one example, a cell at a converging point or a diverging point of the first and second paths may be repositioned when placing the second set of cells (e.g., when the cell at the converging or diverging point has a positive slack). In one example, the nets of the first path are routed before the second set of cells are placed (e.g., routing the nets of the first path while placing the first set of cells of the first path). In one example, paths that are more critical in timing are placed before the paths that are less critical in timing. For example, it is determined whether or not the second path is more critical in timing than a third path; and, the second set of cells are placed before the cells of the third path if the second path is more critical in timing than the third path. A route of a wire, which is previously routed, is used in determining a timing parameter for determining whether or not the second path is more critical in timing than the third path. Similarly, the first set of cells are placed before the second set of cells if the first path is more critical in timing than the second path; and, the routes of wires, which are previously routed, are used in determining timing parameters for determining whether or not the first path is more critical in timing than the second path. A list of paths to be placed can be sorted according to a timing parameter; and, the paths are placed sequentially according to the list. When the routes of the wires are not available (e.g., when the wires are not routed), estimates are made in evaluating the timing parameter. The list of paths is updated according to updated timing parameters after some of the paths are placed and routed in one example. In one example, at least a portion of the first set of cells is placed one cell after another along the first path in a direction (e.g., a direction from a source of the first path toward a destination of the first path; or, a direction from the destination toward the source). In one example, a first portion of the first set of cells is placed one cell after another along the first path in a direction from a source of the first path toward a destination of the first path; and, a second portion of the first set of cells is placed one cell after another along the first path in a direction from the destination toward the source. A path splitting net is used to divide the first path into the first and second portions; and, the path splitting net is selected based on its drive strength. In one example, the net driven by a strong driver is selected as a path splitting net. In one example, the first and second paths are within a portion of the integrated circuit; and, the cells within the portion of the integrated circuit are grouped in paths for placing and routing the portion of the integrated circuit (e.g., in modifying a portion of a design).

In one embodiment of the present invention, a method to layout an integrated circuit includes: placing a first cell at a first location, at which the first cell overlaps with a portion of a second cell that is placed at a second location before the first cell is place; and moving the second cell from the second location to a third location to reduce overlapping (e.g., to eliminate overlapping) with the first cell placed at the first location. In one example, the illegal placement of the first cell with overlapping is allowed when the first cell is larger than the second cell. The second location may coincide with the first location; and, in one example, the first location is determined from optimizing a design goal, which is improved when an area of overlapping between the first and second cells is reduced. In one example, the illegal placement is generated in increasing the size of the first cell; in another example, the illegal placement is generated in inserting the first cell to buffer a signal.

In one embodiment of the present invention, a method to layout an integrated circuit includes: evaluating a first timing parameter for a cell of the integrated circuit at a first location; evaluating a second timing parameter for the cell at a second location; and placing the cell at a selected one of the first and second locations according to the first and second timing parameters. At least one of the first and second timing parameters is evaluated based on a route of a net that is previously routed. The net is on a path on which the cell is located; and, the net is connected to the cell on the path in one example. In one example, a first congestion indicator is evaluated for the cell at the first location; a second congestion indicator is evaluated for the cell at the second location; and, the selected one of the first and second locations is determined from the first and second congestion indicators when the first and second timing parameters are better than a threshold. In one example, the cell is not relocated if the cell is previously placed and if the cell is neither a converging point nor a diverging point of two paths. In one example, the cell is on a first path; and, the selected one of the first and second locations is determined from optimizing a design goal which is improved when a distance between a location for placing the cell and a destination of the first path is reduced.

In one embodiment of the present invention, a method to layout an integrated circuit includes: determining a plurality of nets of a path; generating a plurality of placement designs; and selecting a first design from the plurality of placement designs. Each of the placement designs is generated from: placing cells of a first segment of the path near a first location; and placing cells of a second segment of the path near a second location. The first segment and the second segment are connected by one of the plurality of nets. In one example, at least one of the nets of the path is routed for each of the placement designs; and, the first design is selected based on routes of the nets routed for each of the placement designs. In one example, the plurality of nets are determined according to drive strength of corresponding nets; and, nets driven by strong drivers are selected as the plurality of nets in one example. In one example, it is determined whether or not the first design has a long wire driven by a weak driver. When the first design has a long wire driven a weak drive, the driver is resized to improve the timing for the path; alternatively, a buffer is inserted to improve the timing for the path. In one example, the illegal placement of the resized driver or the inserted buffer is tolerated when overlapping occurs; and, overlapping is eliminated in subsequent operations.

The present invention includes apparatuses which perform these methods, including data processing systems which perform these methods and computer readable media which when executed on data processing systems cause the systems to perform these methods.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

Many of the methods of the present invention may be performed with a digital processing system, such as a conventional, general purpose computer system. Special purpose computers which are designed or programmed to perform only one function may also be used.

Figure 1:
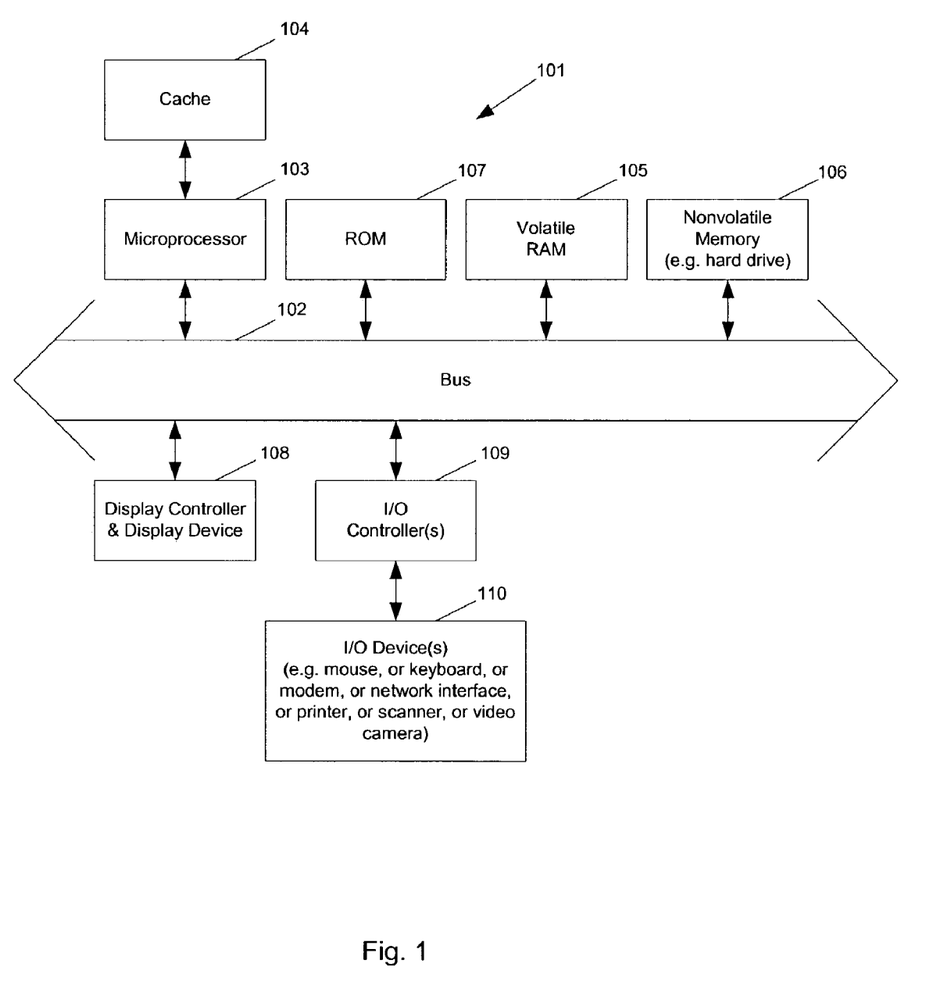
FIG. 1 shows a block diagram example of a data processing system which may be used with the present invention.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103, which may be a G3 or G4 microprocessor from Motorola, Inc. or IBM is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

At least one embodiment of the present invention seeks to incrementally place and route cells along timing critical paths with extensions to place and route subsections of paths and optimize placement of path divergence/convergence points.

Figure 3:
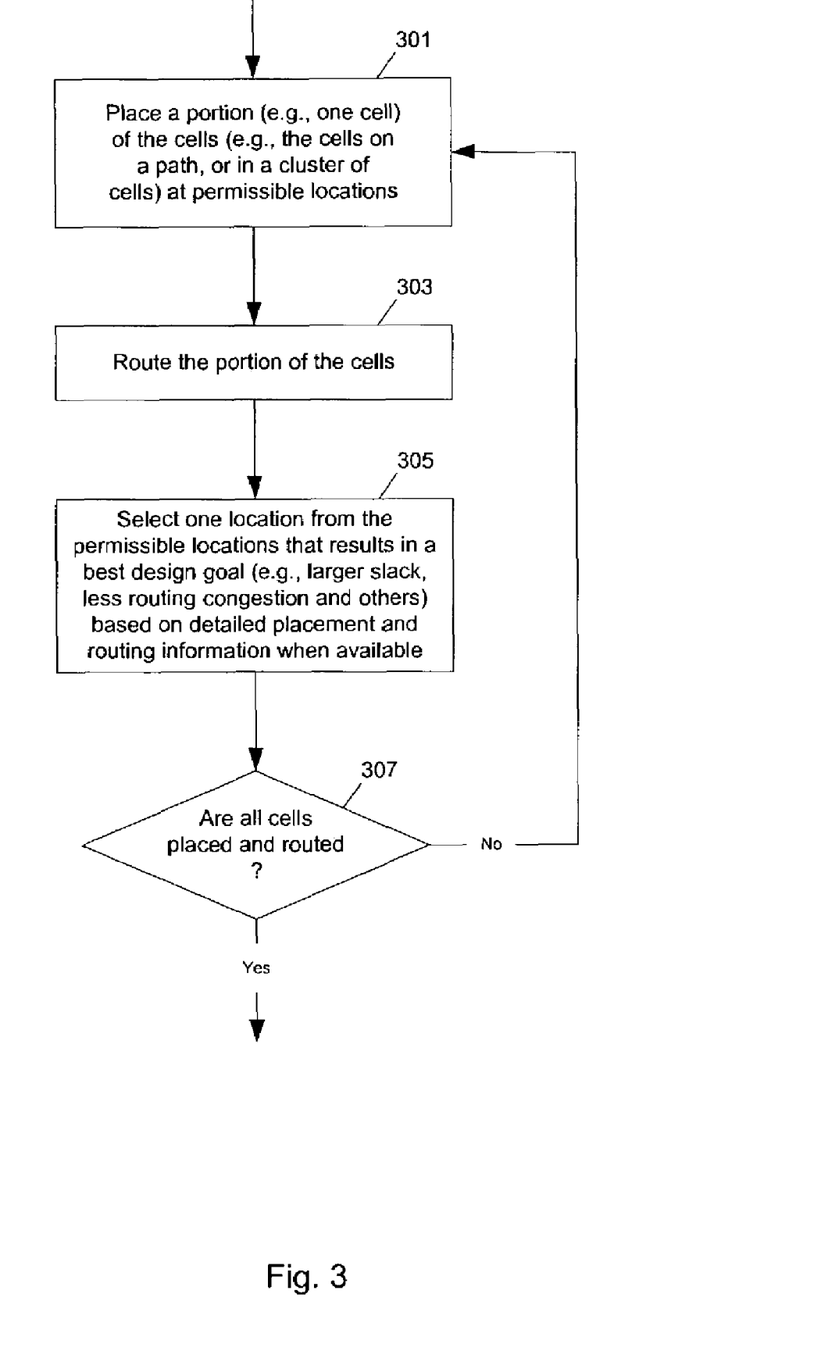
FIG. 3 shows a method to place and route the cells of an integrated circuit according to one embodiment of the present invention.

FIG. 3 shows a method to place and route the cells of an integrated circuit according to one embodiment of the present invention. After operation 301 places a portion (e.g., one cell) of the cells of an integrated circuit (e.g., the cells on a path, or in a cluster of cells) at permissible locations, operation 303 routes the portion of the cells. A permissible location is a location that has an area for the cell. Other conditions (e.g., being restricted to a specific region on a chip, the type of the cell, or others) may also be used in defining a permissible location to reduce the number of alternative permissible locations. Operation 305 selects one location from the permissible locations that results in a best design goal (e.g., larger slack, less routing congestion and others) based on detailed placement and routing information. For cells that have not been placed or nets that have not been routed, estimations are used in evaluating the design goals for the permissible locations; for cells that have been placed and nets that have been routed, detailed placement and routing information is used to compute the design goal, which typically depends, at least partially, on a timing parameter computed based on the actual or estimated placement and routing information. Once the best location for placing the portion of cells is determined, the result for routing the portion of the cells at the best location is kept. Alternatively, operation 303 may only estimate the routing results for nets connected to the portion of the cells; after operation 305 determines the best location based on the estimated routing results, actual routing for the portion of the cells placed at the best location is performed (before other portions of the cells are placed and routed). If operation 307 determines that not all cells are placed and routed (or, if optimizations or modifications to a local region are necessary), operations 301-305 can be repeated for another portion of the cells of the integrated circuit.

Figure 4:
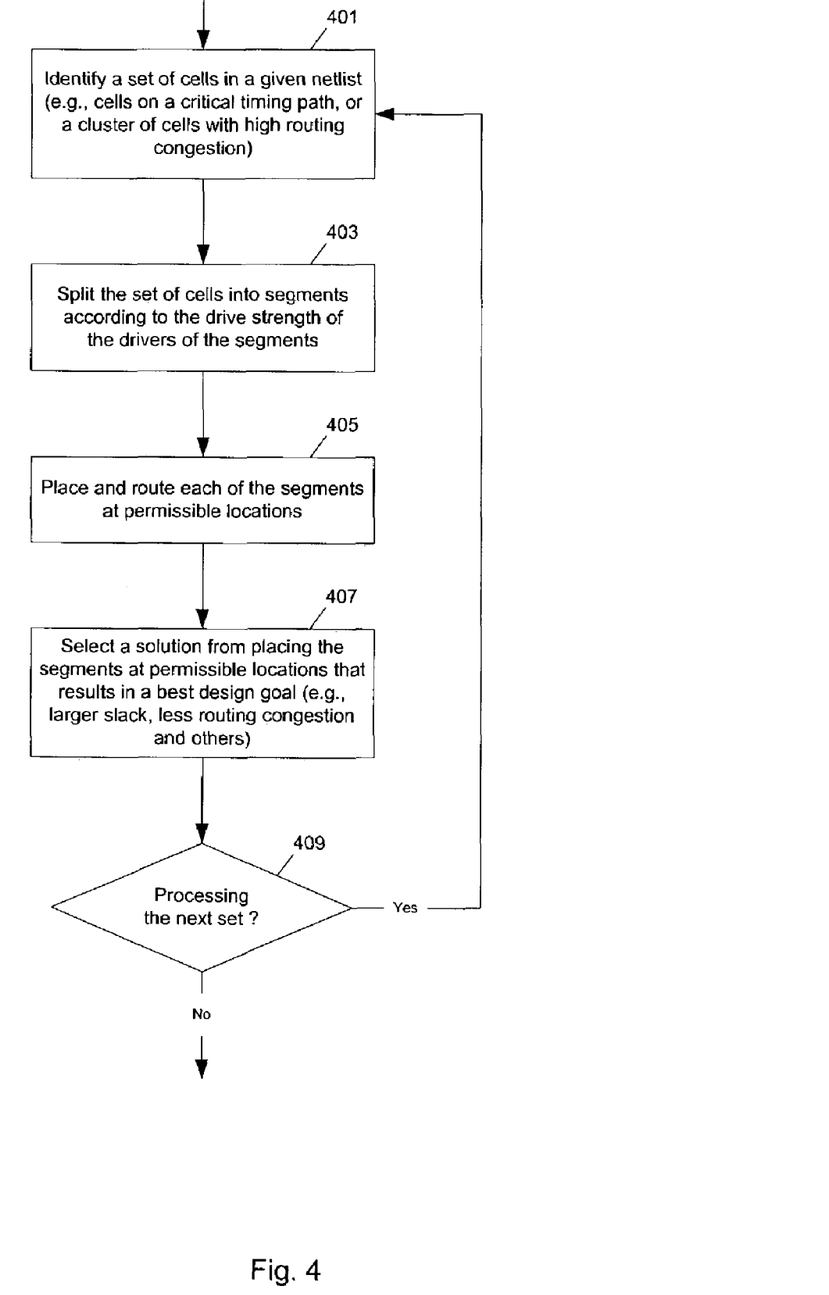
FIG. 4 shows a detailed method to place and route the cells of an integrated circuit according to one embodiment of the present invention.

FIG. 4 shows a detailed method to place and route the cells of an integrated circuit according to one embodiment of the present invention. After operation 401 identifies a set of cells in a given netlist (e.g., cells on a critical timing path, or a cluster of cells with high routing congestion), the set of cells are split into segments according to the drive strength of the drivers of the segments in operation 403. One or more strong drivers may be selected to split the set of cells. After operation 405 places and routes each of the segments at permissible locations for the segments, operation 407 selects one best solution from placing the segments at the permissible locations, which results in a best design goal (e.g., larger slack, less routing congestion and others). For example, cells for each segment can be placed and routed near a clustered area at a permissible location. Long wires may be used to connect the segments. From different cluster locations, the best solution can be selected from optimizing a design goal. Since the overall wire length may be minimized by placing the clustered areas on a line on the source and the destination of the path, the permissible locations for the segments of the path may be selected from locations near the line passing the source and destination of the path. Operations 401-407 are repeated until operation 409 determines that all sets of cells are processed.

Figure 5:
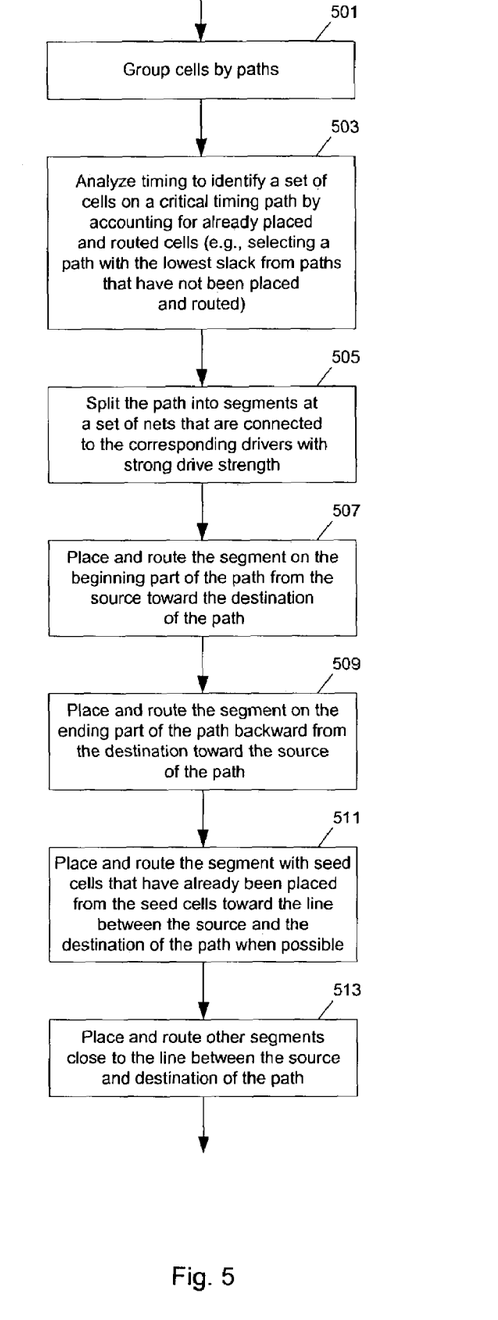
FIG. 5 shows a method to place and route the cells of an integrated circuit based on paths according to one embodiment of the present invention.

FIG. 5 shows a method to place and route the cells of an integrated circuit based on paths according to one embodiment of the present invention. Operation 501 groups cells by paths. Operation 503 analyzes timing to identify a set of cells on a critical timing path by accounting for already placed and routed cells (e.g., selecting a path with the lowest slack from paths that have not been placed and routed). When detailed information for the placement of a cell or routing a net (logic wire) is not available (since the cell has not been placed or the net has not been routed), estimations are used in the timing analysis of operation 503; otherwise, detailed placement and routing information is used. Operation 505 splits the path into segments at a set of nets that are connected to the corresponding drivers with strong drive strength. In one embodiment of the present invention, operation 505 is not performed; and, the entire path is placed and routed one cell after another along the path from the source to the destination (or backward from the destination to the source). Operation 507 places and routes the segment on the beginning part of the path from the source toward the destination of the path; and, operation 509 places and routes the segment on the ending part of the path backward from the destination toward the source of the path. If there is a segment with a seed cell that has already been placed (e.g., placed and routed when processing a previous path), operation 511 places and routes the segment from the seed cells toward the line between the source and the destination of the path when possible. If there are other segments, operation 513 places and routes these segments close to the line between the source and destination of the path in clusters. Long wires may be used to connect the segments of the path. A number of different designs (e.g., different number of segments at different cluster locations, or segments separated at a different set of nets) may be evaluated to select a solution that optimizes a design goal. After all the segments of the path are placed and routed (and the best design is selected), operation 503 may be performed again to identify the next path to be placed and routed. Alternatively, a timing analysis is performed to sort the list of paths according to the slack of the paths; and, the list of paths are processed sequentially. The order of the list of remaining paths may be changed after one or more paths are placed and routed, when detailed placement and routing information for the accurate assessment of the timing parameters is available.

Although operations 403 and 505 suggest that the cells are split at nets driven by strong drivers, it is not necessary to split the cells at strong drivers. Any net on a path may be used to split a path. Selecting a set of nets driven by strong drivers limits the number of different choices for splitting the path, resulting in runtime savings. In one embodiment of the present invention, a set of alternative path splitting nets driven by strong drivers is selected. The path is placed once for each of the splitting nets, which splits the path into two segments for placing near the source and the destination locations; and, the path placement for one of the splitting nets with the best timing (or other design goal) is selected. However, in the event that the best path placement from the set of splitting nets still results in a long wire driven by a weak driver, all nets in the path are considered as splitting nets to select a best splitting net. If the best path placement for a net selected from all nets on the path as splitting nets still results in a long wire driven by a weak driver, sizing/buffering (e.g., in place optimization) of such nets can be considered. Such sizing/buffering may result in an illegal placement for the current iteration, which will be fixed in following iterations.

In one embodiment of the present invention, illegal placements may be tolerated during iterations; and, more than one iterations may be used to reach a final solution without illegal placements. Placers in general operate best when sizes of the objects to be placed are fairly uniform; and, difficulties arise when placing a mix of large and small objects. Traditional placers for FPGA designs typically provide suboptimal results with objects of mixed sizes; and, traditional placers for ASIC designs use methodologies where objects larger than standard cells such as memories are excluded from the standard cell area, which increases the wire lengths to and from those larger cells.

To handle a mix of small, medium and large cells, a method according to one embodiment of the present invention splits the placement iteration into two or more phases. The first phase allows illegal overlapping placements of objects (e.g., large objects overlapping with previously placed small objects). The amount of overlap of a large object with previously placed small objects is taken as part of the cost function for selecting the best placement. In a second phase of the iteration, the placement of the larger objects from the first phase is locked down; and, only the smaller objects that overlap with the larger objects in the first phase are relocated so that they are not placed on top of the larger objects. When there is a very large range of object sizes, more than two placement phases per iteration could be used to eventually eliminate all illegal placements.

Figure 6:
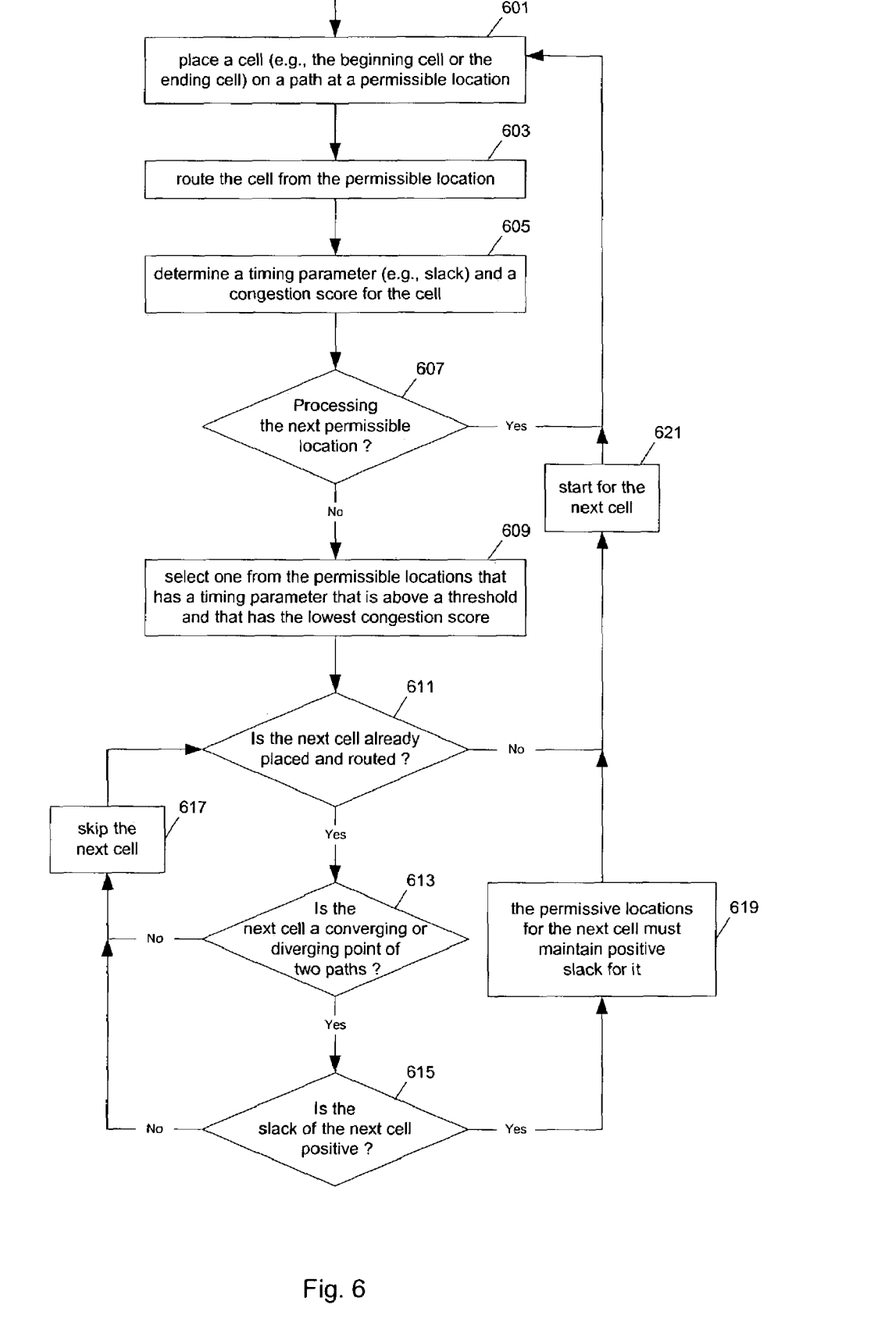
FIG. 6 shows a method to place and route the cells on a path according to one embodiment of the present invention.

FIG. 6 shows a method to place and route the cells on a path according to one embodiment of the present invention. Operation 601 places a cell (e.g., the beginning cell or the ending cell) on a path at a permissible location. Operation 603 routes the cell from the permissible location. Operation 605 determines a timing parameter (e.g., slack) and a congestion score for the cell. Operations 601-605 are repeated until operation 607 determines that all permissible locations for the cell are evaluated. Then, operation 609 selects one from the permissible locations which has the lowest congestion score and which has a timing parameter (e.g., slack) that is above a threshold. When none of the permissible locations has a timing parameter that is above the threshold, the location with the best timing parameter is selected. In one embodiment of the present invention, the distance to the destination (or source location if placing backward) is also considered in selecting a best location. Since different paths may share cells, a cell on a later placed path may be already placed in processing an earlier placed path. If operation 609 determines that the next cell is not already placed and routed, operation 621 starts to process the next cell; otherwise, operation 613 determines whether or not the next cell is a converging or diverging point of two paths. If the next cell is not the converging or diverging point of two paths, operation 617 skips the next cell to process the cell after the next cell on the path; otherwise, operation 615 determines whether or not the slack of the next cell is positive. If the next cell has positive slack, the next cell may be relocated to a permissible location that maintains positive slack for it; otherwise, the next cell is skipped by operation 617 to preserve the previous allocated location for it.

The foregoing description of the methods in FIGS. 3-6 assumes a particular process flow in which certain operations or actions follow other operations or actions. It will be appreciated that alternative flows may also be practiced with the present invention. Other alternative sequences of operations may be envisioned by those skilled in the art.

Figure 7:
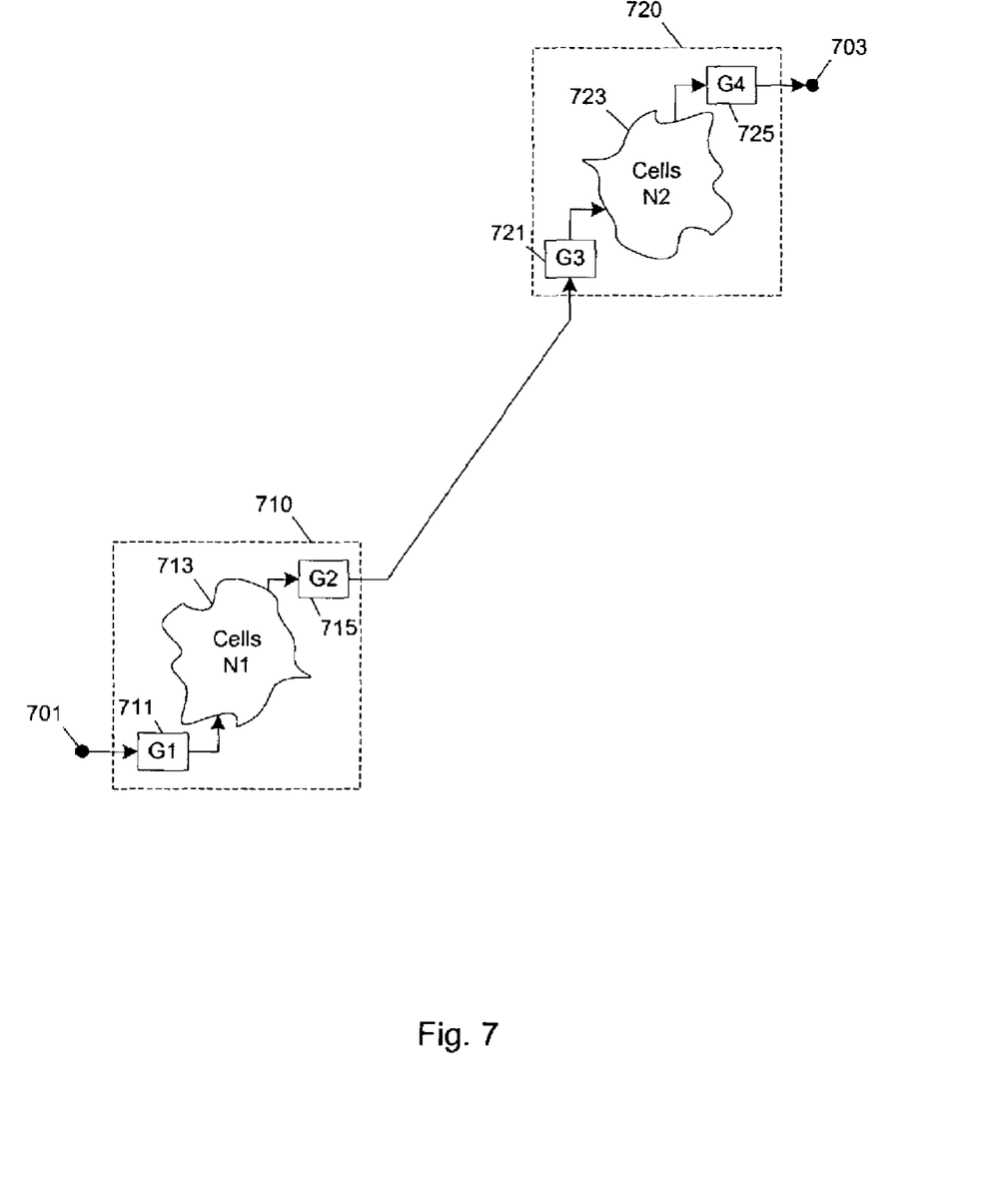
FIG. 7 shows an example to place and route the cells on a path in areas near the source and destination locations according to one embodiment of the present invention.

FIG. 7 shows an example to place and route the cells on a path in areas near the source and destination locations according to one embodiment of the present invention. Consider that the drive strength of cell 715 is the strongest on the path from source 701 to destination 703. Thus, the path is split at the net (logic wire) connecting cells 715 and 721. The segment of the path from cell 711 to cell 715 may be placed in cluster 710 near source 701; and, the segment of path from cell 721 to cell 725 may be placed in cluster 720 near destination 703. To achieve such clustering, the segment near source 701 is placed starting with cell 711 and ending with cell 715; and, the segment near destination 703 is placed backward, starting with cell 725 and ending with cell 721. The segment in cluster 710 is placed toward destination 703; and, the segment in cluster 720 is placed toward source 701. However, it is not necessary to split the path at the net after the strongest driver. A number of different nets may be selected to split the path in a number of different ways; and, the best result is selected from the different designs (e.g., splitting and placing the path in a number of different ways).

Figure 8:
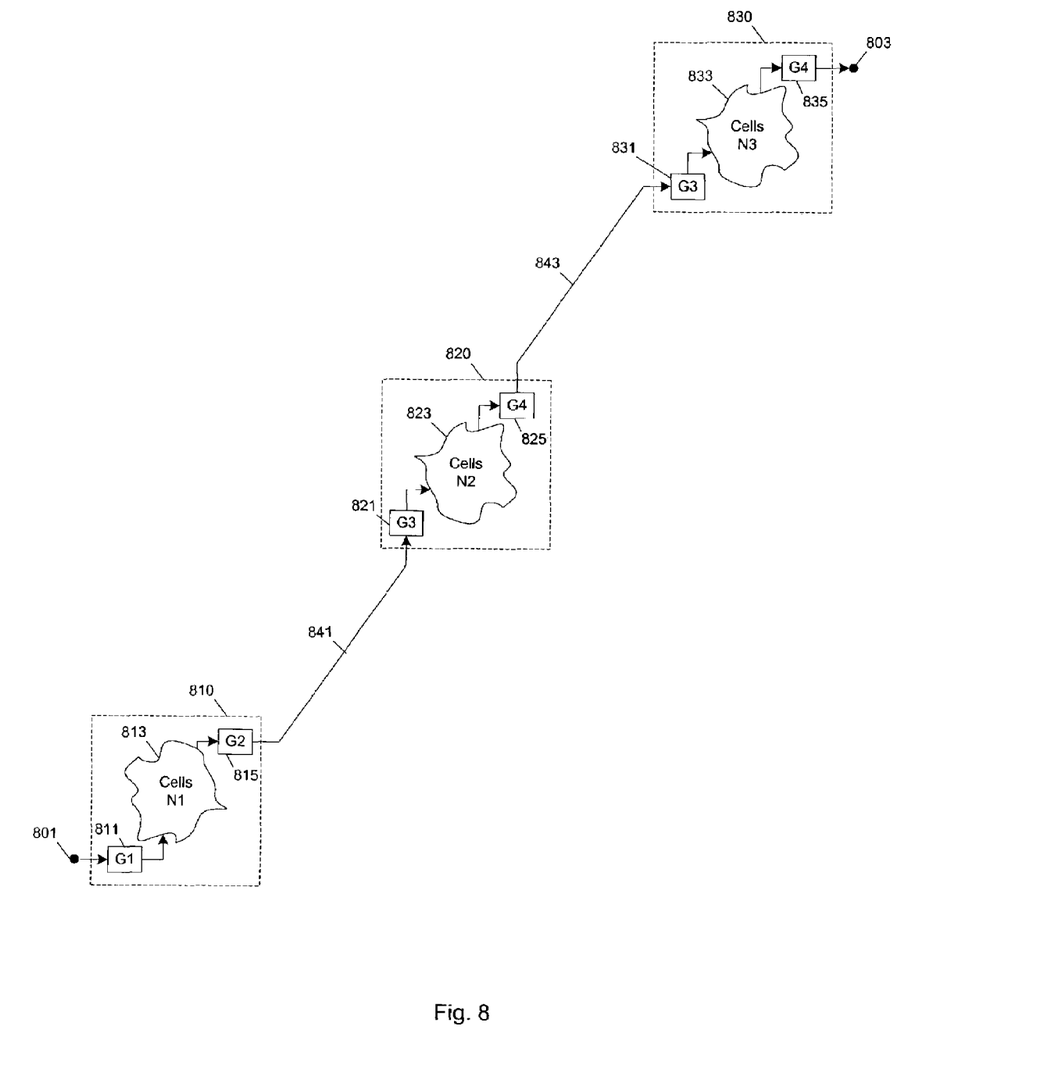
FIG. 8 shows an example to place and route the cells on a path in clusters according to one embodiment of the present invention.

FIG. 8 shows an example to place and route the cells on a path in clusters according to one embodiment of the present invention. A path may be broken into a number segments at a set of nets connected to drivers of strong strength. Consider that drivers 815 and 825 have the strongest driving strength. The segments of the cells can be placed in three clusters 810, 820, and 830 near the line on source 801 and destination 803. Similar to the segments in clusters 710 and 720 in FIG. 7, the segments in clusters 810 and 830 are placed close to the source and the destination of the path. The segment in cluster 810 is placed forward from cell 811 to cell 815; and, the segment in cluster 830 is placed backward from cell 835 to cell 831. The path from cell 821 to cell 825 is placed in cluster 820 near the line on source 801 and destination 803. Long wires 841 and 843 are used to connect the segments. The location of cluster 820 may be determined from a seed cell in the segment, which is already placed (e.g., placed and routed when processing a previous path). A number of permissible locations may be evaluated before a best location for placing the cluster is selected. A different number of segments of the path may be generated from a different number of splitting nets to generate different designs for placing the path; and, a best solution can be selected from optimizing a cost function.

Figure 9:
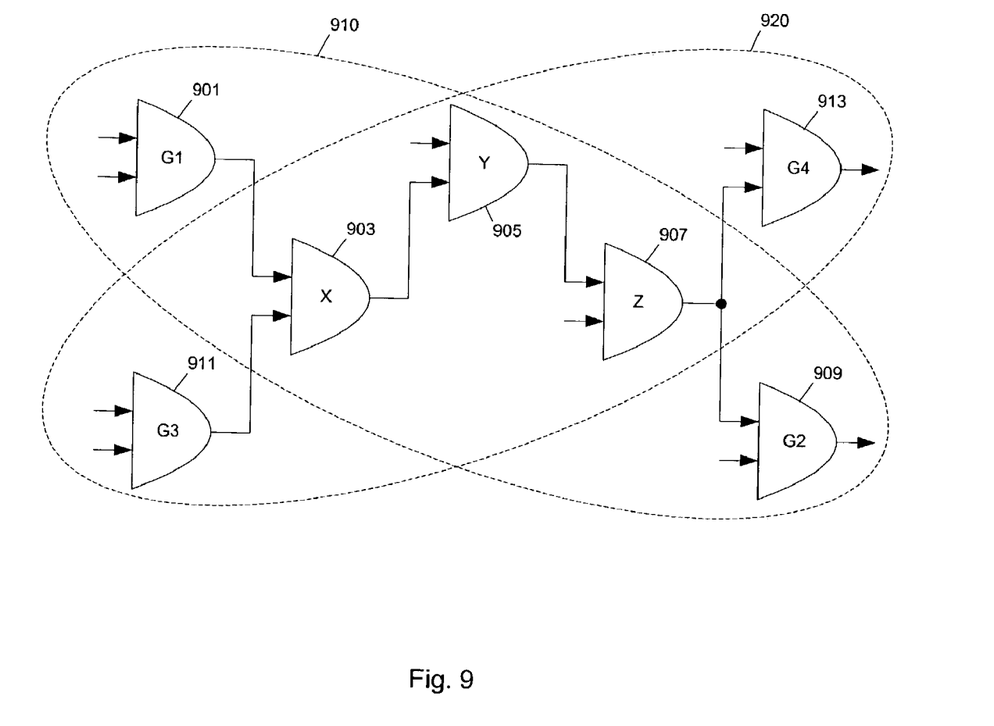
FIG. 9 shows an example to place and route the cells that are shared by two paths according to one embodiment of the present invention.

FIG. 9 shows an example to place and route the cells that are shared by two paths according to one embodiment of the present invention. Consider that path 910 of cells 901, 903, 905, 907 and 909 is more critical in timing than path 920 of cells 911, 903, 905, 907, and 913. The two paths share cells 903, 905 and 907; cell 903 is the converging point of the two paths; and, cell 907 is the diverging point of the two paths. Path 920 is placed and routed after path 910 is placed and routed. After cell 911 is placed and routed, cell 903 is checked. Since cell 903 is already placed and is a converging point of the two paths, cell 903 may be relocated if it has positive slack. When cell 903 is relocated, it must be relocated to a location so that cell 903 remains to have positive slack. If it has a negative slack or it cannot be relocated to another location to maintain positive slack, the previously assigned location for cell 903 is not changed. Cell 905 is also already placed (e.g., when path 910 is placed and routed). However, cell 905 is neither a converging point nor a diverging point. Thus, the location of cell 905 is not changed. Similar to cell 903, cell 907 is a diverging point; cell 907 may be relocated if it has positive slack before and after relocation. Thus, re-allocation of resources is performed for a cell that is a divergence/convergence point of critical paths, if, for the current allocation, the cell has positive slack and the new resource allocation maintains positive slack at the cell. This restriction is used to reduce the number of cells that are repeatedly evaluated as well as to maintain as much of the placement of more critical paths.

At least one embodiment of the present invention seeks to assign cell/gate resources and routing resources for the cells/gates and nets in a given netlist in several iterations over the design. At the start of each of the iterations, timing analysis is done to compute the critical timing paths by comparing propagation delays to timing constraints (e.g., slack). The timing analysis computes delays by accounting for the existing assignment of cell and routing resources and using the pre-determined delays for those resources to calculate timing along paths (connected cells) in the netlist. For the initial timing analysis, a default allocation of resources is assumed where all nets have identical delay. The cells are grouped by path. A given cell can be in more than one path. The paths are ordered by slack, where paths with the lowest slack are considered first. The path ordering can be kept fixed during an iteration to save runtime, or dynamically updated as placement of the paths proceeds. A new allocation of cell and routing resources is then determined on a path basis.

When assigning resources to a path, the path is examined starting with the cell that originates the path (e.g., the output of a sequential cell or an input pad/port cell) and proceeding to the next connected cell in the path. For each cell in a path, the valid locations are examined. A location is valid if is its cell resources are not yet assigned and the cell is legal to place there. Legality of the cell can, for example, depend on the type of cell or routing resources at the location, or the available area at the location. For each valid location, timing analysis is done assuming that the given cell is assigned to cell resources at the location and that fastest available routing is assigned to the nets connected to the given cell. Also, wire lengths for all nets connected to the cell are used to calculate an estimated congestion score for the cell. All other cells and nets are assumed to either keep the resources assigned to them in the current iteration or the resources assigned from the previous iteration. After all valid locations are considered, the given cell is assigned the location and routing resources that yield the highest slack for that cell. If the slack for possible locations is above a given positive threshold, the location with the lowest congestion score is chosen to reduce possible routing congestion. Since a cell can belong to more than one path, during processing of a path that has not yet been assigned resources, a cell that is already placed and routed for the current iteration can be encountered. In such a case, the existing resource assignments of the cell are kept and processing of the path continues to the next cell that is not yet assigned resources. Alternatively, an exception is made to cells at converging and diverging points of paths, which may be relocated when they have positive slack (or slack that is above a threshold value).

One embodiment of the present invention picks a set of alternative path splitting nets (cell output wires along the path). For each splitting net, the beginning of the path up to the splitting net is placed as in the preceding paragraph; and, the end of the path is placed backwards from the end of the path. One splitting net from the set of alternative splitting nets that yields the best placement and routing result is selected. In some technologies such as ASIC, the fastest placement for a path will cluster a set of cells near the source, followed by a long wire driven by the strongest driver in the path, followed by a cluster near the destination. This will be the fastest placement assuming that wire resistance is not significant. It is not always possible to achieve this partitioning of a path because of resource limitations near either the source or destination of the path. In one embodiment of the present invention, the set of splitting nets are chosen according to the drive strength of their driver; in another embodiment of the present invention, all nets on the path are selected as the set of alternative splitting nets.

While placing a cell in the path, the eventual destination of the path can be used to determine a wire length bonus for approaching the eventual destination. The wire length bonus can be used to break ties between otherwise equivalent placement options for a cell. In one embodiment of the present invention, the wire length bonus is also used in determining the cost function (or design goal) for optimization.

If a path is long enough such that resistance is significant, the ideal placement may be of several clumps of cells along the line between the source and destination of the path. The splitting nets as defined previously ideally divide the clumps. A located seed for each clump can be found by finding a cell in each clump that has connections to previously placed cells for the placement iteration. In each case the size of the clump is checked against locally available resources.

As cells are placed along a path, either an actual route or a route estimate is performed for the connected nets based on the placement. This is not as feasible in traditional placement methods in which a much larger number of placements for a cell are considered. With a good global placement (such as generated by a quadratic placer) the number of placement iterations will usually be less than 10. This makes it affordable from a CPU time perspective to do routing during placement even for very large problems.

Global timing can be updated for each of the placement iterations, after the placement of a path, or after each cell in a path is assigned a location. Early iterations use less frequent updates to save CPU time.

At the end of each of the iterations, all cells and nets have been assigned resources; otherwise, the design is not feasible with the given resources. The current assignment of resources is evaluated. The worst (lowest) slack on any path is used to score the current solution. For all solutions, the one with the best score is kept. If two solutions have the same score, a second scoring function based on the 10 worst path slacks is used to determine which to keep.

In one embodiment of the present invention, resources are assigned for small, specific clusters (windows) of cells, instead of entire timing paths. The criteria to be optimized during placement and routing can also be used to select the clusters. For example, if the goal is to optimize timing delay, the selected group of cells will be a subsection of a critical timing path and the neighboring connected cells. If routing congestion is to be reduced, the cells can be selected from areas with high routing congestion. Also, the area for allocation can be reduced to a subspace of the entire available chip. For example, allocation of new cell and routing resources for a cluster can be restricted to a rectangular area that is the bounding box for the current allocation of the cells. The cells in the window can be grouped in paths starting at the inputs of the window (input nets that cross the window boundary) and end at the outputs of the window (output nets that cross the window boundary). The list of paths are sorted so that the most timing critical path is placed first. The first cell to place will be the start of the most timing critical path; and, the next cell to place will be the next cell along the same path. Thus, instead of a path-based allocation across the entire available chip area, a cluster based allocation across a sub-area of the available chip can be performed to optimize local areas of the design with enhanced runtime and practical problem sizes.

At least one embodiment of the present invention simultaneously allocates cell and routing resources (places and routes each gate separately); and, the algorithm incrementally places and routes an individual path or cluster of cells, while preserving resource allocation of the rest of the design. Implementation of one embodiment of the present invention for Xilinx Virtex/VirtexE FPGAs produced an average clock period improvement of 10% on a set of benchmark designs.

While most embodiments of the present invention are intended for use in an HDL design synthesis software program, the invention is not necessarily limited to such use. Although use of other languages and computer programs is possible (e.g. a computer program may be written to describe hardware and thus be considered an expression in an HDL and may be compiled or the invention, in some embodiments, may allocate and reallocate a logic representation, e.g. a netlist, which was created without the use of an HDL), embodiments of the present invention will be described in the context of use in HDL synthesis systems, and particularly those designed for use with integrated circuits which have vendor-specific technology/architectures. As is well known, the target architecture is typically determined by a supplier of programmable ICs. An example of a target architecture is the programmable lookup tables (LUTs) and associated logic of the integrated circuits which are field programmable gate arrays from Xilinx, Inc. of San Jose, Calif. Other examples of target architecture/technology include those well known architectures in field programmable gate arrays and complex programmable logic devices from vendors such as Altera, Lucent Technology, Advanced Micro Devices, and Lattice Semiconductor. For certain embodiments, the present invention may also be employed with application-specific integrated circuits (ASICs).

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method to layout an integrated circuit, the method comprising:
    analyzing timing to identify a set of cells on a path;
    splitting the path into segments at a plurality of nets that includes determining the plurality of nets of the path;
    generating a plurality of placement designs for the path, wherein each of the placement designs is generated from placing and routing cells of a first segment of the path near a first location that includes placing a cell of the first segment at a permissible location out of a plurality of permissible locations; routing the cell from the permissible location; and determining a timing parameter associated with the cell already placed and routed, and subsequently, after the routing of the cells of the first segment, placing and routing cells of a second segment of the path near a second location, the first segment and the second segment being connected by one of the plurality of nets;
    routing at least one of the nets of the path for each of the plurality of placement designs; and
    selecting a first design from the plurality of placement designs, wherein said selecting is based on actual routes of the at least one of the nets routed for each of the plurality of placement designs.

2. A method as in claim 1 wherein the plurality of nets are determined according to drive strength of corresponding nets.

3. A method as in claim 1 further comprising:
    resizing a driver of the first design to increase drive strength of a wire of the first design.

4. A method as in claim 3 wherein the driver overlaps with a cell after said resizing.

5. A method as in claim 1 further comprising:
    inserting a cell to buffer a wire of the first design.

6. A method as in claim 5 wherein, after said inserting, the cell to buffer the wire overlaps with a cell that is previously placed.

7. A machine readable medium containing executable computer program instructions which when executed by a digital processing system cause said system to perform a method to layout an integrated circuit, the method comprising:
    analyzing timing to identify a set of cells on a path;
    splitting the path into segments at a plurality of nets that includes determining the plurality of nets of the path;
    generating a plurality of placement designs for the path, wherein each of the placement designs is generated from placing and routing cells of a first segment of the path near a first location that includes placing a cell of the first segment at a permissible location out of a plurality of permissible locations; routing the cell from the permissible location; and determining a timing parameter associated with the cell already placed and routed, and subsequently, after the routing of the cells of the first segment, placing and routing cells of a second segment of the path near a second location, the first segment and the second segment being connected by one of the plurality of nets; routing at least one of nets of the path for each of the plurality of placement designs; and
    selecting a first design from the plurality of placement designs, wherein said selecting is based on actual routes of the at least one of nets routed for each of the plurality placement designs.

8. A medium as in claim 7 wherein the plurality of nets are determined according to drive strength of corresponding nets.

9. A medium as in claim 7 wherein the method further comprises:
    resizing a driver of the first design to increase drive strength of a wire of the first design.

10. A medium as in claim 9 wherein the driver overlaps with a cell after said resizing.

11. A medium as in claim 7 wherein the method further comprises:
    inserting a cell to buffer a wire of the first design.

12. A medium as in claim 11 wherein, after said inserting, the cell to buffer the wire overlaps with a cell that is previously placed.

13. A digital processing system to layout an integrated circuit, the digital processing system comprising:
    mean for analyzing timing to identify a set of cells on a path;
    means for splitting the path into segments that includes means for determining the plurality of nets of the path;
    means for generating a plurality of placement designs for the path, wherein each of the placement designs is generated by means for placing and routing cells of a first segment of the path near a first location that includes means for placing a cell of the first segment at a permissible location out of a plurality of permissible locations; means for routing the cell from the permissible location; and means for determining a timing parameter associated with the cell already placed and routed, and means for subsequently, after the routing of the cells of the first segment, placing and routing cells of a second segment of the path near a second location, the first segment and the second segment being connected by one of the plurality of nets;

means for routing at least one of nets of the path for each of the plurality of placement designs; and means for selecting a first design from the plurality of placement designs, wherein said selecting is based on actual routes of the at least one of nets routed for each of the plurality of placement designs.

14. A digital processing system as in claim 13 wherein the plurality of nets are determined according to drive strength of corresponding nets.

15. A digital processing system as in claim 13 further comprising:

means for resizing a driver of the first design to increase drive strength of a wire of the first design.

16. A digital processing system as in claim 15 wherein the driver overlaps with a cell after the drive is resized.

17. A digital processing system as in claim 13 further comprising:

means for inserting a cell to buffer a wire of the first design.

18. A digital processing system as in claim 17 wherein, after the cell is inserted, the cell to buffer the wire overlaps with a cell that is previously placed.

* * * * *